(12) United States Patent
Bush et al.

(10) Patent No.: US 11,158,828 B2
(45) Date of Patent: Oct. 26, 2021

(54) SOLAR CELL COMPRISING AN OXIDE-NANOPARTICLE BUFFER LAYER AND METHOD OF FABRICATION

(71) Applicant: The Board of Trustees of the Leland Stanford Junior University, Stanford, CA (US)

(72) Inventors: Kevin Alexander Bush, Stanford, CA (US); Colin David Bailie, Morgan Hill, CA (US); Michael David McGehee, Palo Alto, CA (US); Tomas Leijtens, Golden, CO (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/711,842

(22) Filed: Dec. 12, 2019

(65) Prior Publication Data

US 2020/0136072 A1 Apr. 30, 2020

Related U.S. Application Data

(62) Division of application No. 15/769,287, filed as application No. PCT/US2016/058156 on Oct. 21, 2016, now Pat. No. 10,522,774.

(Continued)

(51) Int. Cl.
*H01L 51/44* (2006.01)
*H01L 31/0216* (2014.01)
*H01L 51/00* (2006.01)
*H01L 51/42* (2006.01)
(Continued)

(52) U.S. Cl.
CPC ...... *H01L 51/442* (2013.01); *H01L 31/02167* (2013.01); *H01L 31/0725* (2013.01);
(Continued)

(58) Field of Classification Search
CPC ............... H01L 51/442; H01L 31/0725; H01L 31/02167; H01L 51/424; H01L 27/302; H01L 51/441
(Continued)

(56) References Cited

U.S. PATENT DOCUMENTS 7,148,417 B1  12/2006  Landis
9,391,287 B1  7/2016  Huang et al.
(Continued)

FOREIGN PATENT DOCUMENTS

AU    2013319979 A1   3/2015
WO    2014/045021 A1  3/2014
(Continued)

OTHER PUBLICATIONS

Authorized Officer: Lee W. Young, "International Search Report and Written Opinion" issued in related PCT App. No. PCT/US2015/063817 dated Mar. 22, 2016.
(Continued)

*Primary Examiner* — Thinh T Nguyen
(74) *Attorney, Agent, or Firm* — Kaplan Breyer Schwarz, LLP

(57) ABSTRACT

A buffer layer for protecting an organic layer during high-energy deposition of an electrically conductive layer is disclosed. Buffer layers in accordance with the present invention are particularly well suited for use in perovskite-based single-junction solar cells and double-junction solar cell structures that include at least one perovskite-based absorbing layer. In some embodiments, the buffer layer comprises a layer of oxide-based nanoparticles that is formed using solution-state processing, in which a solution comprising the nanoparticles and a volatile solvent is spin coated onto a structure that includes the organic layer. The
(Continued)

solvent is subsequently removed in a low-temperature process that does not degrade the organic layer.

19 Claims, 8 Drawing Sheets

Related U.S. Application Data

(60) Provisional application No. 62/398,220, filed on Sep. 22, 2016, provisional application No. 62/245,260, filed on Oct. 22, 2015.

(51) Int. Cl.
H01L 31/0725 (2012.01)
H01L 31/0256 (2006.01)
H01L 27/30 (2006.01)

(52) U.S. Cl.
CPC ........ *H01L 51/424* (2013.01); *H01L 51/4233* (2013.01); *H01L 51/441* (2013.01); *H01L 27/302* (2013.01); *H01L 51/0047* (2013.01); *H01L 2031/0344* (2013.01); *H01L 2251/303* (2013.01); *Y02E 10/549* (2013.01)

(58) Field of Classification Search
USPC ............................... 438/82, 99; 257/40, 461
See application file for complete search history.

(56) References Cited

U.S. PATENT DOCUMENTS

| | | | |
|---|---|---|---|
| 9,564,593 | B2 | 2/2017 | Karunadasa et al. |
| 10,522,774 | B2 | 12/2019 | Bush et al. |
| 10,535,791 | B2 | 1/2020 | Mailoa et al. |
| 2002/0081786 | A1 | 6/2002 | Toet et al. |
| 2002/0117199 | A1 | 8/2002 | Oswald |
| 2010/0051098 | A1 | 3/2010 | Sheng et al. |
| 2011/0132423 | A1 | 6/2011 | Joge et al. |
| 2011/0139227 | A1 | 6/2011 | Sivananthan et al. |
| 2011/0146755 | A1 | 6/2011 | Curran et al. |
| 2011/0162697 | A1 | 7/2011 | Sivananthan et al. |
| 2011/0232758 | A1 | 9/2011 | Khanarian et al. |
| 2011/0272012 | A1 | 11/2011 | Heng et al. |
| 2012/0017976 | A1 | 1/2012 | Nechache et al. |
| 2014/0290727 | A1 | 10/2014 | Yamamoto et al. |
| 2015/0053259 | A1 | 2/2015 | Hardin et al. |
| 2015/0249170 | A1 | 9/2015 | Snaith et al. |
| 2015/0303343 | A1 | 10/2015 | Kleimam et al. |
| 2016/0035927 | A1 | 2/2016 | Gershon et al. |
| 2016/0087233 | A1 | 3/2016 | Guha et al. |
| 2016/0133672 | A1 | 5/2016 | Koposov et al. |
| 2016/0163904 | A1 | 6/2016 | Mailoa et al. |
| 2016/0190377 | A1 | 6/2016 | Green |
| 2016/0307704 | A1 | 10/2016 | Hillhouse et al. |
| 2016/0351808 | A1 | 12/2016 | Luchinger et al. |
| 2016/0551808 | A1 * | 12/2016 | Luchinger et al. ... H01L 51/005 |
| 2017/0155007 | A1 * | 6/2017 | Terashita ............ H01L 31/0512 |
| 2017/0194101 | A1 | 7/2017 | Karunadasa et al. |
| 2017/0358398 | A1 | 12/2017 | Beaumont et al. |
| 2018/0277696 | A1 | 9/2018 | Karunadasa et al. |
| 2018/0290897 | A1 | 10/2018 | Snaith et al. |
| 2018/0309077 | A1 | 10/2018 | Bush et al. |
| 2019/0221690 | A1 | 7/2019 | Bush et al. |

FOREIGN PATENT DOCUMENTS

| | | |
|---|---|---|
| WO | 2015/017885 A1 | 2/2015 |
| WO | 2015/085441 A1 | 6/2015 |
| WO | 2017/037448 A1 | 3/2017 |

OTHER PUBLICATIONS

Authorized Officer: Fratiloiu, Silvia, International Search Report and Written Opinion issued in PCT application No. PCT/US2017/051753, dated Nov 29, 2017, 13 pp.

Authorized Officer: Lee W. Young, "International Search Report and Written Opinion" issued in related PCT Application No. PCT/US2016/058156, dated Apr. 19, 2017.

Bush Kevin A et al: "Thermal and environmental stability of semi-transparent perovskite solar cells for tandems by a solution-processed nanoparticle buffer layer and sputtered ITO electrode", 2016 IEEE 43rd Photovoltaic Specialists Conference (PVSC), IEEE, Jun. 5, 2016 (Jun. 5, 2016), pp. 246-248.

Colin D. Bailie et al., "High-efficiency tandem perovskite solar cells", https://web.stanford.edu/group/mcgehee/publications/MRS2015.pdf, "MRS Bulletin", dated Aug. 1, 2015, vol. 40.

European Supplementary Search Report and Search Opinion Received for EP Application No. 16864751.9, dated Jun. 12, 2019, 8 pages.

Examination Report issued in related India Patent Application No. 201827017353 dated Dec. 30, 2019.

Examiner initiated interview summary received for U.S. Appl. No. 14/733,462, dated Oct. 28, 2016, 1 pages.

"Notice of Allowance" issued in related U.S. Appl. No. 14/733,462, dated Nov. 21, 2016, 10 pages.

"Final Office Action", issued in related U.S. Appl. No. 14/733,462, dated Oct. 28, 2016, 28 pages.

"Non-Final Office Action", issue in related U.S. Appl. No. 14/733,462, dated Mar. 10, 2016, 14 pages.

Extended European Search Report issued in EP patent application No. 16864751.9, dated Jun 12, 2019, 8 pp.

Fan Fu et al: "Low-temperature-processed efficient semi-transparent planar perovskite solar cells for bifacial and tandem applications", Nature Communications, vol. 6, Nov. 18, 2015 (Nov. 18, 2015), p. 8932.

Final Office Action received for U.S. Appl. No. 15/397,565, dated Nov. 6, 2019, 12 pages.

GB Application No. 1515546.8, priority document for WO 2017/037448 A1; filed Sep. 2, 2015 (Year: 2015).

Jeremie Werner et al: "Parasitic Absorption Reduction in Metal Oxide-Based Transparent Electrodes: Application in Perovskite Solar Cells", ACS Applied Materials & Interfaces, vol. 8, No. 27, Jun. 24, 2016 (Jun. 24, 2016), pp. 17260-17267.

Lee et al.: "Efficient hybrid solar cells based on meso-superstructured organometal halide perovskites". Science 338, 643-647 (2012).

Liu, et al.: "Efficient planar heterojunction perovskite solar cells by vapour deposition." Nature, 501 (7467), 395-398. (2013).

Loper, et al.: "Organic-inorganic halide perovskites: Perspectives for silicon-based tandem solar cells." IEEE Journal of Photovoltaics, 4(6), 1545-1551. (2014).

Non-Final Rejection received for U.S. Appl. No. 14/958,587, dated Mar. 22, 2019, 25 pages.

Non-Final Rejection received for U.S. Appl. No. 15/397,565, dated Mar. 8, 2019, 15 pages.

Non-Final Rejection received for U.S. Appl. No. 15/769,287, dated Apr. 4, 2019, 11 pages.

Notice of Allowance received for U.S. Appl. No. 14/958,587, dated Oct. 9, 2019, 13 pages.

Notice of Allowance received for U.S. Appl. No. 15/769,287, dated Aug. 29, 2019, 9 pages.

Outgoing Written Opinion of the ISA dated Apr. 7, 2016 for WO Application No. PCT/US15/063817.

Rebecca J. Sutton et al: "Bandgap-Tunable Cesium Lead Halide Perovskites with High Thermal Stability for Efficient Solar Cells", Advanced Energy Materials, vol. 6, No. 8, Feb. 2, 2016 (Feb. 2, 2016), p. 1502458.

Requirement for Restriction/Election received for French Application No. 15/769,287, dated Dec. 6, 2018, 11 pages.

Requirement for Restriction/Election received for U.S. Appl. No. 14/733,462, dated Sep. 25, 2015, 7 pages.

Slavney, Adam H. et al.; A Bismuth-Halide Double Perovskite with Long Carrier Recombination Lifetime for Photovoltaic Applications; D. Am. Ohm. Soc., 2016, 138, 2138-2141 (Year: 2016).

Stoumpos, Constantinos C., et al.; Semiconductng Tin and Lead Iodide Perovskites with Organic Cations: Phase Transitions, High Mobilities, and Near-Infrared Photoluminescent Properties; Inorg. Chem. 2013, 52, 9019-9038 (Year: 2013).

(56) References Cited

OTHER PUBLICATIONS

Tanaka et al: "Bandgap and exciton binding energies in lead-iodide-based natural quantum-well crystals". 2003. Science and technology or advanced materials, 4:6, 599-604.
Todorov, et al.: "Perovskite-kesterite monolithic tandem solar cells with high open-circuit voltage." Applied Physics Letters, 105(17), 173902. (2014).
Yi Wei: "Synthesis and optical properties of self-assembled 2D layered orgnic-inorganic perovskites for optoelectronics". Thesis. ENS Cachan, Jul. 2012.
Advisory Action received for U.S. Appl. No. 15/397,565, dated Feb. 20, 2020, 3 pages.
Office Action issued in counterpart Chinese patent application No. 201680069273.9, dated Jan. 27, 2021, 7 pp.
Hemamala Indivari Karunadasa et al., Related unpublished U.S. Appl. No. 15/397,565 entitled "Halide Double Perovskite Cs2AgBiBr6 Solar-Cell Absorber Having Long Carrier Lifetimes", filed on Jan. 3, 2017, now abandoned.
Hoefler, Sebastian F., et al. "Progress on Lead-Free Metal Halide Perovskites for Photovoltaic Applications: a Review." Monatshefte Fur Chemie—Chemical Monthly, vol. 148, No. 5, Mar. 8, 2017, pp. 795-826., doi:10.1007/s00706-017-1933-9. (Year: 2017).
Non-Final Rejection dated Aug. 25, 2020 for U.S. Appl. No. 15/937,530.
Requirement for Restriction/Election dated Sep 18, 2020 for U.S. Appl. No. 16/334,540.
Requirement for Restriction/Election received for U.S. Appl. No. 15/937,530, dated Mar. 3, 2020, 5 pages.
Communication issued in EP Patent Application No. 16864751.9 dated Mar. 22, 2021.
Li Xin et al, Thickness of ITO thin film influences on fabricating ZnO nanorods applying for dye-sensitized solarcell, Composites: Part B, Elsevier, Amsterdam , NL, pp. 147-152, vol. 74.
Communication from the Examining Division dated Mar. 22, 2021 for EP Application No. 16864751.9.
Final Rejection dated Apr. 21, 2021 for U.S. Appl. No. 15/937,530.
Mosconi, Edoardo, et al. "Electronic and Optical Properties of Mixed Sn—Pb OrganohalidE Perovskites: a First Principles Investigation." Journal of Materials Chemistry A, vol. 3, No. 17, 2015, pp. 9208-9215., doi:10.1039/c4ta06230b. (Year: 2015).
Savory, Christophar N, et al. "Can Pb-Free Halide DoublEE PGrovskitas Support High-Efficiency Solar Cglls?" ACS Energy LEttErs, vol. 1, Oct. 12, 2016, pp. 949-955. (Year: 2016).

* cited by examiner

SOLAR CELL COMPRISING AN OXIDE-NANOPARTICLE BUFFER LAYER AND METHOD OF FABRICATION

STATEMENT OF RELATED CASES

This case is a divisional application of co-pending U.S. patent application Ser. No. 15/769,287 filed on Apr. 18, 2018, which claims priority of U.S. Provisional Patent Application Ser. No. 62/245,260 filed on Oct. 22, 2015 and U.S. Provisional Patent Application Ser. No. 62/398,220 filed on Sep. 22, 2016, each of which is incorporated herein by reference.

STATEMENT REGARDING FEDERALLY SPONSORED RESEARCH

This invention was made with Government support under contract DE-EE0004946 awarded by the Department of Energy. The Government has certain rights in the invention.

FIELD OF THE INVENTION

The present invention pertains generally to optoelectronics and, more particularly, to the formation of transparent electrodes for solar cells.

BACKGROUND OF THE INVENTION

A solar cell is an optoelectronic semiconductor device that converts the energy of light incident upon it directly into electricity. The incident light is absorbed in an absorption layer of the solar-cell, which gives rise to the generation of free electrical carriers (i.e., electrons and holes). The free electrical carriers produce a voltage across the terminals of the device, which can be used to directly power electrical systems or be stored in an electrical storage system (e.g., a battery, etc.) for later use.

In order to generate a free-carrier pair in the absorption material, a photon must have energy greater than energy bandgap (EG) of the material. The EG of a material is the energy difference between the top of its valence band (the highest energy level populated by bound electrons) and the bottom of its conduction band (the lowest energy level populated by free electrons). When a photon is absorbed, its energy is given over to a bound electron-hole pair, which frees the electron and enables it to go from the valence band into the conduction band. The energy of a photon is inversely proportional to its wavelength ($E_p = hc/\lambda$, where $E_p$ is photon energy, h is Planck's constant, c is the speed of light, and $\lambda$ is wavelength); therefore, longer-wavelength light (e.g., red light) has lower photon energy than shorter-wavelength light (e.g., blue light). As a result, the choice of semiconductor used to absorb the light has significant impact on the efficiency of a solar cell.

Silicon is perhaps the most commonly used absorbing material in solar-cells at present, due to its relatively low EG, highly developed fabrication infrastructure, and low cost as compared to other semiconductor materials. Unfortunately, silicon does not efficiently absorb light. In addition, since the free electrons and free holes tend to occupy energy levels at the bottom of the conduction band and the top of the valence band, respectively, any extra energy that the electron-hole pairs receive from higher-energy photons is converted into heat that is transferred into the semiconductor material in a process referred to as "thermalization." Thermalization reduces the energy-conversion efficiency of the solar cell and also raises the temperature of the device, which can lead to degradation and lifetime issues.

In the quest for improved device performance, the solar-cell community has been aggressively searching for material alternatives to silicon, and perovskites are now seen as being among the most attractive silicon substitutes. In fact, in recent years, perovskite-based solar cell efficiencies have become extremely competitive with silicon-based devices. Their rapid rise is the result of a unique combination of properties, including strong optical absorption and long ambipolar diffusion lengths enabled by the benign nature of their intrinsic defects. In addition, perovskites are well suited for use in the top cell of a tandem solar-cell configuration, which enables improved energy-conversion efficiency and thermalization loss than can be achieved in more conventional single-cell devices.

A tandem solar cell is a stacked structure comprising a top photovoltaic portion that is made of a material having a relatively higher EG and a bottom photovoltaic portion that is made of a material having a relatively lower EG. In other words, a tandem solar cell has two p-n junctions and two different band gaps. When light is incident on the stacked structure, high-energy photons are first absorbed in the top portion, while lower-energy photons pass through the top portion to be absorbed in a bottom photovoltaic portion. This enables a broader spectrum of light to be absorbed, thereby improving energy-conversion efficiency beyond the single-junction efficiency limit. In addition, thermalization in the bottom cell is reduced because of the absorption of high-energy photons in the top cell. Depending on the EG of the material of the top solar cell, the fundamental efficiency limit for silicon-based tandem solar cells can be as high as approximately 39% —significantly higher than the theoretical efficiency limit of 33.7% for a single-junction silicon solar cell.

Perovskites are particularly attractive for use in the top cell in tandem solar cell configurations having bottom cells comprising a wide variety of lower-EG materials (e.g., silicon, copper indium gallium selenide (CIGS), etc.) because perovskites have wide, tunable bandgaps and solution processability. As a result, perovskites offer a pathway to achieving industry goals of improving efficiency while continuing to drive down module cost.

Perovskite-based tandem solar cells have been demonstrated in both mechanically stacked, four-terminal configurations and monolithically integrated three-terminal configurations. Mechanically stacked tandem structures have seen the largest success, recently reaching a power conversion efficiency over 24%. The mechanically stacked architecture has some advantages over monolithically integrated structures—most notably, it simplifies device fabrication, allows for silicon surface texturing, and requires no current matching. Monolithically integrated tandem structures, however, have greater promise due to the fact that they have fewer transparent electrode layers.

To date, however, the commercial viability of both single-junction and tandem perovskite-based solar cells has been limited due to thermal and environmental instability issues. Perovskites are susceptible to moisture and methylammonium egress. In addition, halides in the perovskite material can react with metal electrodes, leading to electrode corrosion. Efforts have been made in the prior art to stabilize the perovskite, such as using a hydrophobic heterojunction contact or providing an encapsulation layer that mitigates moisture ingress or a pinhole-free metal oxide layer to prevent metal-halide interaction. Little progress has been made for preventing methylammonium egress, however.

In addition, the top electrode of a solar cell must be highly transparent, as well as highly conductive. Due to fabrication constraints, however, light must first pass through a hole-transport layer (e.g., Spiro-OMeTAD) in a standard architecture, or an electron-acceptor layer (e.g., [6,6]-phenyl-C61-butyric acid methyl ester ([60]PCBM), [6,6]-phenyl-C61-butyric acid methyl ester ([61]PCBM), bathocuproine (BCP), etc.) in an inverted architecture, before entering the perovskite, which gives rise to significant parasitic losses.

The de facto industry standard for transparent contacts is a sputtered indium tin oxide (ITO), which is typically deposited as thin film via RF-magnetron sputtering. Unfortunately, the temperatures during deposition and post-annealing may accelerate methylamine evolution, resulting in irreversible damage of the perovskite active layer. In addition, the high energy of the sputtered electrode-material particles can easily damage the perovskite and carrier-extraction layers (i.e., Spiro-OMeTAD, PCBM, bathocuproine (BCP), etc.) during the sputtering process, leading to degradation of device performance.

The addition of a buffer layer on top of the perovskite/carrier-extraction layer stack prior to contact formation is viewed as a potential approach for mitigating the problems associated with ITO deposition. Unfortunately, prior-art buffer layers have poor long-term stability due to their chemical reactivity with perovskite compositions. In addition, prior-art buffer layers have been plagued by low efficiency, which degrades fill factor and open-circuit voltage. Further, many prior-art buffer layers require additional vacuum processes, such as evaporation, which undesirably complicates solar-cell fabrication. Still further, some prior-art buffer layers are not compatible with many desirable device architectures. Molybdenum oxide ($MoO_x$), for example, cannot be used in an inverted solar-cell architecture.

The ability to readily form high-quality, highly transparent contact windows on perovskite-based solar-cell structures remains, as yet, undemonstrated in the prior art.

SUMMARY OF THE INVENTION

The present invention enables the formation of a transparent conducting electrode (TCO), such as an indium tin oxide (ITO) contact, in optoelectronic devices/circuits in which it would otherwise be problematic or impossible. In accordance with the present teachings, this is accomplished via a buffer layer comprising solution-processed oxide nanoparticles. Embodiments of the present invention are particularly well suited for use in single-junction and dual-junction solar cell architectures.

An illustrative embodiment of the present invention is an inverted-structure, single-junction, perovskite-based solar cell comprising a transparent conducting electrode of sputter-deposited ITO, which is disposed on a buffer layer comprising a plurality of wide-bandgap oxide-based nanoparticles. In the illustrative embodiment, the nanoparticles are zinc oxide nanoparticles; however, in some embodiments, the nanoparticles comprise a different oxide, including metal oxides and semiconductor oxides. In some embodiments, the oxide nanoparticles are doped with another material, such as aluminum, hydrogen, indium, gallium, etc., to improve their conductivity.

The inclusion of the nanoparticle buffer layer enables the ITO layer to be deposited and annealed without resulting in damage to the perovskite layer. In some embodiments, such as tandem solar cells, the ability to anneal the ITO material is particularly important because it improves its crystallinity, which increases its electrical conductivity and optical transparency.

The nanoparticle buffer layer is formed, using solution-based processes that are performed at low temperatures (e.g., <200° C., and preferably within the range of approximately 60° C. to 75° C.), on a layer structure that includes a perovskite-based absorption layer located between an n-type heterojunction layer that acts as an electron-selective (i.e., hole blocking) layer and a p-type heterojunction layer that acts as a hole-selective layer. The ability to form the buffer layer via low-temperature, solution-based processing simplifies the overall fabrication process and mitigates degradation of underlying layers. This is particularly important in embodiments in which the buffer layer is formed on underlying organic materials, such as in the illustrative embodiment.

In some embodiments, the perovskite absorption layer is included as the top cell of a tandem solar cell. In some embodiments, the tandem solar cell includes a bottom cell comprising silicon. In some embodiments, the tandem solar cell includes a material other than silicon, such as CIGS, a lower EG perovskite, and the like. In some embodiments, a buffer layer in accordance with the present invention is incorporated in another device structure, such as an organic light-emitting diode (OLED), organic thin-film transistor (OTFT), an electrochromic, and the like.

An embodiment of the present invention is an optoelectronic device comprising: a first layer comprising an organic material; a second layer comprising a plurality of oxide nanoparticles, the oxide nanoparticles of the plurality thereof being characterized by a wide bandgap; and a first transparent conductive electrode; wherein the second layer is between the first layer and the first transparent conductive electrode.

Another embodiment of the present invention is an optoelectronic device comprising: a first layer comprising a first material, the first material comprising a first perovskite and having a first energy bandgap (EG); a first electrical contact that is in electrical communication with the first layer, the electrical contact being substantially transparent for a first light signal characterized by a first wavelength range; and a buffer layer that is between the electrical contact and the first layer, the buffer layer comprising plurality of oxide nanoparticles.

Yet another embodiment of the present invention is a method for forming an optoelectronic device, the method comprising: providing a first organic layer; forming a first buffer layer comprising a first plurality of oxide nanoparticles; and forming a first transparent conductive electrode such that it is disposed on the first buffer layer.

DETAILED DESCRIPTION

Figure 1:
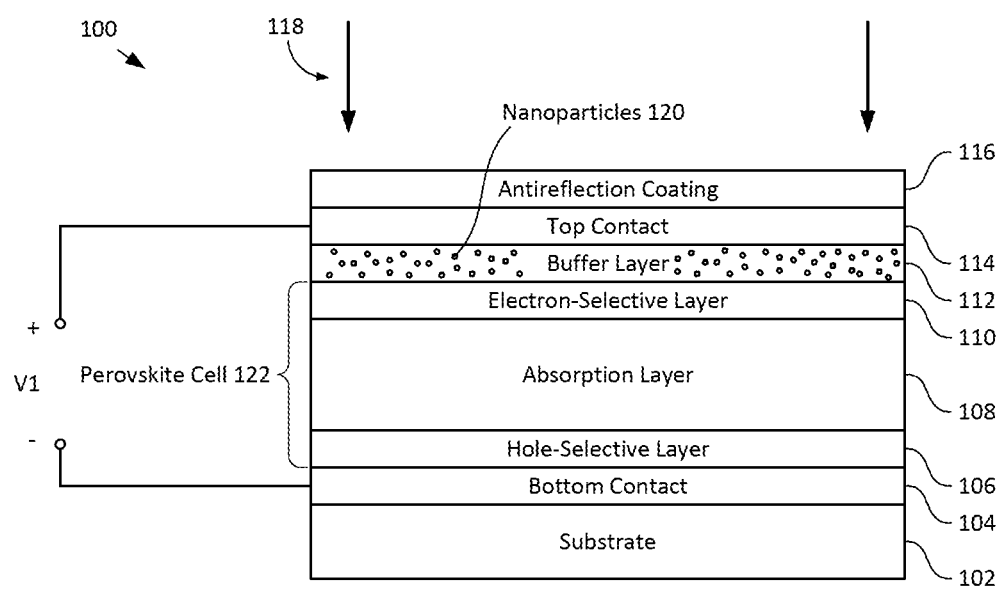
FIG. 1 depicts a single-junction, perovskite-based solar cell in accordance with an illustrative embodiment of the present invention.

FIG. 1 depicts a single-junction, perovskite-based solar cell in accordance with an illustrative embodiment of the present invention. Solar cell 100 includes substrate 102, bottom contact 104, hole-selective layer 106, absorption layer 108, electron-selective layer 110 (also referred to as electron-acceptor layer 110), buffer layer 112, top contact 114, and antireflection coating 116, arranged as shown. Solar cell 100 generates output voltage, V1, when illuminated with light signal 118. Although the illustrative embodiment is a single-junction solar cell that incorporates a buffer layer in accordance with the present invention, it will be clear to one skilled in the art, after reading this Specification, that the present invention is more broadly applicable to other solar-cell architectures (tandem solar-cell structures, etc.), as well as for the fabrication of other structures, such as organic light-emitting diodes (OLEDs), organic thin-film transistors (OTFTs), and electrochromics, among others optoelectronic devices.

Figure 2:
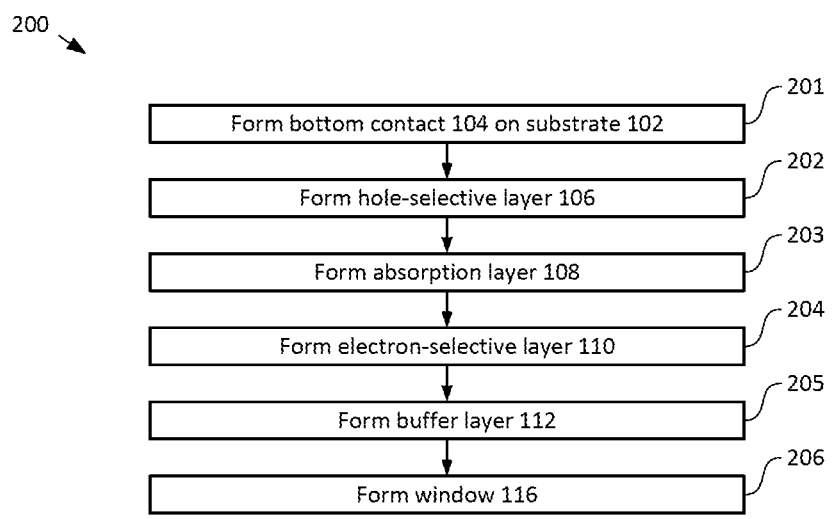
FIG. 2 depicts operations of a method suitable for forming solar cell 100.

FIG. 2 depicts operations of a method suitable for forming solar cell 100. Method 200 begins with operation 201, wherein bottom contact 104 is formed such that it is disposed on conventional glass substrate 102. For the purposes of this Specification, the term "disposed on" (or "formed on") is defined as "exists on" an underlying material or layer. This layer may comprise intermediate layers, such as transitional layers, necessary to ensure a suitable surface. For example, if a material is described to be "disposed (or grown) on a substrate," this can mean that either (1) the material is in intimate contact with the substrate; or (2) the material is in contact with one or more transitional layers that reside on the substrate.

Bottom contact 104 is a layer of ITO having a thickness suitable for providing low electrical sheet resistance. A typical value for the thickness of bottom contact 104 is approximately 170 nanometers (nm); however, one skilled in the art will recognize that any practical thickness can be used.

At operation 202, hole-selective layer 106 is formed on bottom contact 104 to define a hole-selective contact for solar cell 100. Hole-selective layer 106 is a substantially smooth, hydrophilic layer of poly(3,4-ethylenedioxythiophene) polystyrene sulfonate (PEDOT:PSS), which is formed by spin coating aqueous PEDOT:PSS onto bottom contact 104 and curing it. As will be appreciated by those skilled in the art, a variety of other materials can be used to form this layer, including, without limitation, small molecules such as spiro-OMeTAD, other polymers, such as poly triarylamine (PTAA), and inorganic materials, such as NiO.

At operation 203, absorption layer 108 is formed on hole-selective layer 104. In the depicted example, absorption layer 108 comprises a $CH_3NH_3PbI_3$ perovskite that is formed by dissolving lead(ii) acetate (PbAc) and methylammonium iodide (MAI) (1:3 molar ratio) in n,n-dimethylformamide (DMF) and spinning the resultant solution onto a substrate. The layer is initially dried at room temperature and then annealed at 100° C. for 5 minutes. One skilled in the art will recognize, after reading this Specification, that myriad perovskite layers can be used in absorption layer 108 without departing from the scope of the present invention. Other perovskites suitable for use in the present invention include, without limitation, $Cs_xFA_{1-x}Pb(Br_yI_{1-y})_3$, pure formamidinium based perovskite ($FAPbI_3$), tin containing perovskites $Cs_xFA_{1-x}Pb_zSn_{1-z}(Br_yI_{1-y})_3$ etc. Further, one skilled in the art will recognize that many alternative methods can be used to form a layer of perovskite without departing from the scope of present invention.

Absorption layer 108 and hole-selective layer 104 collectively define a p-type heterojunction within solar cell 100.

At operation 204, electron-acceptor layer 110 is formed by spin-coating liquid-phase organic material onto the perovskite of absorption layer 108 and curing it via a low-temperature anneal. In the depicted example, electron-acceptor layer 110 is a layer of [60]PCBM having a thickness of approximately 20 nm. It is preferable that the layer of PCBM be thin to ensure good electron-extraction properties, while still achieving high optical transmission. Electron-acceptor layer 110 and absorption layer 108 collectively define an n-type heterojunction in solar cell 100. In some embodiments, a layer of lithium fluoride (LiF) is included as a passivation layer between electron-acceptor layer 110 and absorption layer 108. Electron-acceptor layer 110 is formed. In some embodiments, PCBM also prevents the development of an extraction barrier. In some other embodiments, the organic material can be an electrically-active material, such as [70]PCBM, spiro-OMeTAD or a polymer organic, such as PTAA.

In some embodiments, electron-acceptor layer 110 includes a thin layer of bathocuproine (BCP), which is evaporated on the PCBM layer to improve hole blocking and electron extraction.

For convenience, the layers of solar cell 100 between bottom contact 104 and buffer layer 112 (i.e., hole-selective layer 106, absorption layer 108, and electron-selective layer 110, as well as any additional associated layers) are referred to herein, collectively, as perovskite cell 122.

At operation 205, buffer layer 112 is formed on electron acceptor layer 110. Buffer layer 112 comprises a layer of oxide nanoparticles 120, which is formed by dispersing a solution comprising the nanoparticles and isopropyl alcohol (IPA), spin coating the mixture onto layer 110 to form a nascent buffer layer, and enabling the removal of the solvent from the solution (e.g., via evaporation at room temperature or at a slightly elevated temperature in an oven or on a hotplate).

Each of nanoparticles 120 comprises a wide-bandgap oxide, wherein "wide bandgap" is defined as an effective energy bandgap greater than 2.0 eV. In the depicted example, nanoparticles 120 comprise zinc oxide that is doped with approximately 2 mol % aluminum (i.e., AZO). Zinc oxide is a particularly attractive host material of nanoparticles 120 due to its deep valence level of approximately −7.6 eV. In addition, the use of aluminum-doped zinc oxide (AZO) nanoparticles reduces or eliminates the development of an extraction barrier that can arise from a misalignment of the work functions of ZnO and the ITO of top contact 114, thereby achieving a more ohmic top contact. However, one skilled in the art will recognize, after reading this Specification, that many alternative materials can be used in nanoparticles 120 without departing from the scope of the present invention. Alternative materials suitable for use in nanoparticles 120 include, without limitation, tin oxide ($SnO_2$), titanium oxide ($TiO_2$), tungsten oxide ($W_2O_3$), aluminum oxide ($Al_2O_3$), silicon dioxide ($SiO_2$), nickel oxide (NiO), molybdenum oxide ($MoO_x$), etc. Further, those skilled in the art will understand that the nanoparticles can be doped with many materials other than aluminum; including, without limitation, hydrogen, indium, gallium, and the like. A characteristic of a suitable dopant is that it can be alloyed into the host material (e.g., zinc oxide, etc.) and improve the conductivity of the host material. In some other embodiments, wide-bandgap oxide materials are undoped.

It is an aspect of the present invention that forming buffer layer 112 using solution-based processing avoids some of the complications that arise in the prior art. For example, it is well known that bonds within a perovskite can be broken when material is deposited on the perovskite material using a high-energy process, such as sputtering. Since solution-based processing low-energy, its use enables buffer layer 112 to be formed on the perovskite material of absorption layer 110 with little or no damage.

At operation 206, top contact 114 is formed on buffer layer 112 such that it is substantially transparent for light signal 118. For the purposes of this Specification, including the appended claims, "transparent" is defined as having a transmittance equal to or greater than 60%, where transmittance is typically measured at a wavelength of 550 nm, corresponding to the maximum of the human eye luminosity curve. To form top contact 114, a layer of ITO having a thickness within the range of approximately 60 nm to approximately 500 nm (preferably approximately 100 nm) is sputtered onto buffer layer 112 and then annealed at a temperature less than or equal to 200° C. It is another aspect of the present invention that the presence and robustness of the layers of buffer layer 112 enable the sputter deposition of the ITO as a transparent electrode with little or no damage to underlying electron-selective layer 110 or the perovskite material of absorption layer 108.

In some embodiments, another material suitable for forming a substantially optically transparent, electrically conductive layer (e.g., AZO, IZO, HZO, etc.) is sputtered onto buffer layer 112.

At optional operation 207, antireflection coating 116 is formed on top contact 114 via conventional evaporation. In the depicted example, antireflection coating 116 is a layer of magnesium fluoride ($MgF_2$) having a thickness of approximately 150 nm; however, any suitable antireflection coating can be used in embodiments of the present invention. In some embodiments, an additional antireflection coating is formed on the bottom surface of substrate 102.

Fully fabricated solar cells analogous to solar cell 100 were found to have an open circuit voltage (Voc) greater than 0.9 V, which evinces the efficacy of buffer layer 112 for protecting the integrity of the organic layers of the solar cell structure (i.e., absorption layer 108 and electron-selective layer 110).

It should be noted that the materials and layer thicknesses provided herein are merely exemplary and that alternative materials and/or layer thicknesses can be used without departing from the scope of the present invention.

Figure 3A:
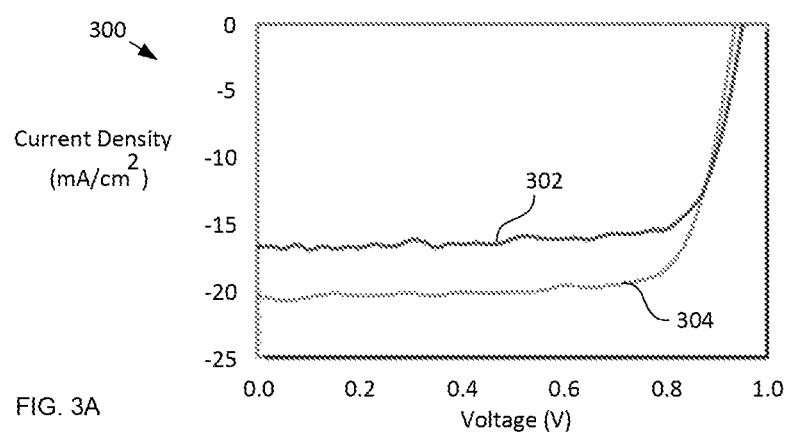
FIG. 3A depicts plots of current density as a function of applied voltage for two solar cells having structures analogous to that of solar cell 100.

FIG. 3A depicts plots of current density as a function of applied voltage for two solar cells having structures analogous to that of solar cell 100. Plot 300 has measured current density vs. applied voltage for solar cells 302 and 304. Solar cell 302 includes a semi-transparent bottom contact 104 made of a substantially transparent layer of ITO.

Solar cell 304 includes an opaque bottom contact 104 that includes layers of aluminum and silver. Measurement data was taken while illuminating solar cells 302 and 304 through aperture masks having apertures of 0.39 $cm^2$ and 0.12 $cm^2$, respectively.

Figure 3B:
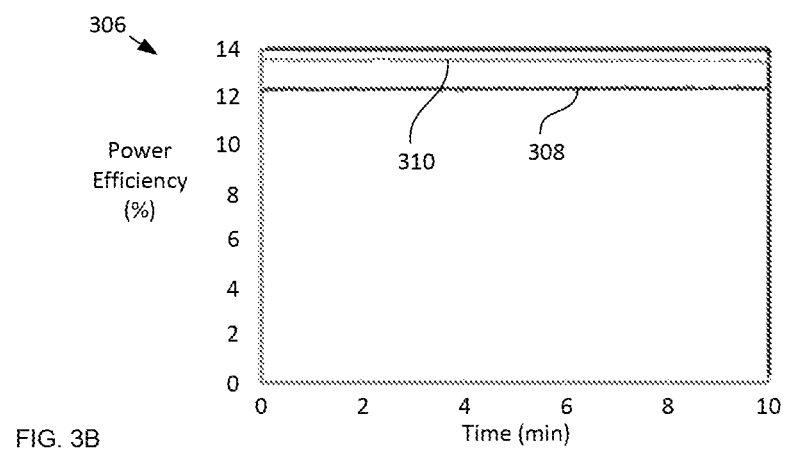
FIG. 3B depicts plots of efficiency over time for solar cells 302 and 304.

FIG. 3B depicts plots of efficiency over time for solar cells 302 and 304.

The results shown in plots 300 and 306 demonstrate the efficacy of buffer layer 112 as a support layer for the formation of an operative top contact using conventional sputtering without damage to the underlying organic layers. First, the fill factor and voltage for solar cells 302 and 304 are substantially comparable, demonstrating that a top contact 114 disposed on an oxide-nanoparticle-based buffer layer (i.e., buffer layer 112) operates in normal fashion. Second, the fill factor and voltage for solar cells 302 and 304 are comparable. It should be noted that the lower current density measured for solar cell 302 can be attributed to the fact that its bottom contact does not function as a back reflector. Third, plot 306 shows that the inclusion of buffer layer 112 enables operation of the solar cells at room temperature with a stabilized power efficiency of 12.3% and 13.5% for solar cells 302 and 304, respectively.

Table 1 below summarizes measurement data obtained for solar cells 302 and 304.

TABLE 1

Photovoltaic parameters of single-junction perovskite-based solar cells having semi-transparent and opaque bottom contacts.

|  | $J_{SC}$ [mA/$cm^2$] | VOC [mV] | FF | Efficiency [%] |
| --- | --- | --- | --- | --- |
| Solar Cell 302 | 16.5 | 952 | 0.77 | 12.3 |
| Solar Cell 304 | 18.8 | 938 | 0.77 | 13.5 |

As discussed above, in some embodiments, the host material of nanoparticles 120 is doped to facilitate ohmic-contact operation of top contact 114. By employing doped oxide-based nanoparticles in buffer layer 112 (e.g., AZO), the work functions of the host material (e.g., ZnO) and the material of top contact 114 (e.g., ITO) can be more closely aligned. This mitigates the development of an extraction barrier that can impair operation of the solar cell.

It is an aspect of the present invention that the ability to form a high-quality transparent contact on a structure comprising organic materials enables device structures that were difficult, if not impossible, to produce in the prior art. Examples of such structures include, without limitation, mechanically stacked tandem solar cells including a perovskite-based top cell, monolithically integrated tandem solar cells including a perovskite-based top cell, monolithically integrated tandem solar cells including perovskite-based top and bottom cells, and the like.

Figure 4:
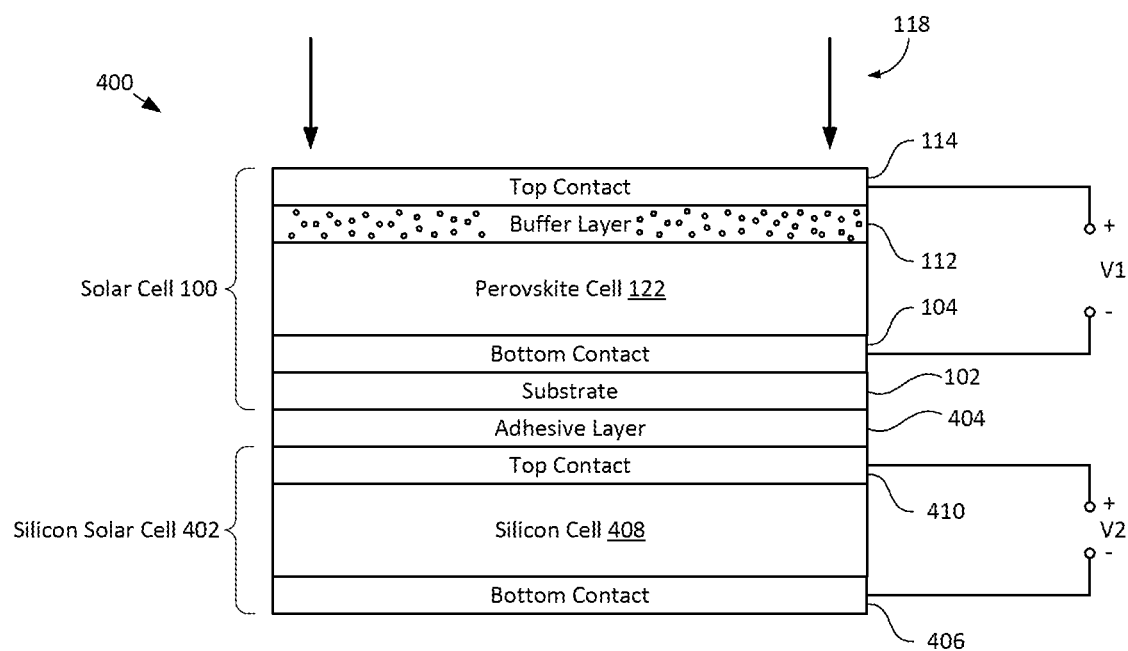
FIG. 4 depicts a schematic drawing of a mechanically stacked tandem solar cell in accordance with the present invention.

FIG. 4 depicts a schematic drawing of a mechanically stacked tandem solar cell in accordance with the present invention. Solar cell 400 includes perovskite solar cell 100, silicon solar cell 402, and adhesive layer 404, which mechanically affixes the two solar cells in hybrid fashion.

Silicon solar cell 402 is a conventional silicon-based solar cell comprising bottom contact 406, silicon cell 408, and top contact 410. One skilled in the art will recognize that, like solar cell 100, a conventional silicon-based solar cell normally includes additional layers, such as p-type and n-type amorphous silicon heterojunction layers, etc. In similar fashion to perovskite cell 122 described above, for convenience, the layers of silicon solar cell 402 between bottom contact 406 and top contact 410 (i.e., absorption layer, heterojunction and carrier-selective layers, etc.) are referred to herein, collectively, as silicon cell 408.

Solar cell 602 is fabricated in substantially conventional fashion, beginning with the texturing of the top surface of a silicon substrate, which functions as the absorption layer of silicon cell 408.

For example, silicon cell 408 begins as a silicon substrate that is an N-type, 280-μm-thick, double-side polished float-zone (FZ) wafer. The top surface of the substrate is textured by first depositing a 250-nm-thick, low-refractive-index silicon nitride layer by plasma-enhanced chemical-vapor deposition (PECVD) on its bottom surface and exposing the unprotected top surface to potassium hydroxide (KOH).

After removal of the nitride layer from the bottom surface, intrinsic and n-type amorphous silicon (a-Si:H) layers (not shown) are deposited on the top surface of the substrate.

In similar fashion, intrinsic and p-type a-Si:H films layers (not shown) are deposited on bottom top surface of the substrate to complete silicon cell 408.

Bottom contact 406 is then formed by depositing a layer of silver (or other suitable electrically conductive material) having an appropriate thickness.

Top contact 410 is formed by depositing, in conventional fashion, a layer of a transparent electrically conductive material. In the depicted example, top contact 410 comprises a layer of ITO having a thickness of approximately 500 nm.

Once silicon solar cell 402 is complete, it is joined with solar cell 100 in conventional fashion. In the depicted example, the solar cells are affixed via adhesive layer 404, which is a layer of electrically insulating epoxy that is substantially transparent for light signal 118. In some embodiments, solar cells 100 and 402 are mechanically joined via another conventional method.

Figure 5A:
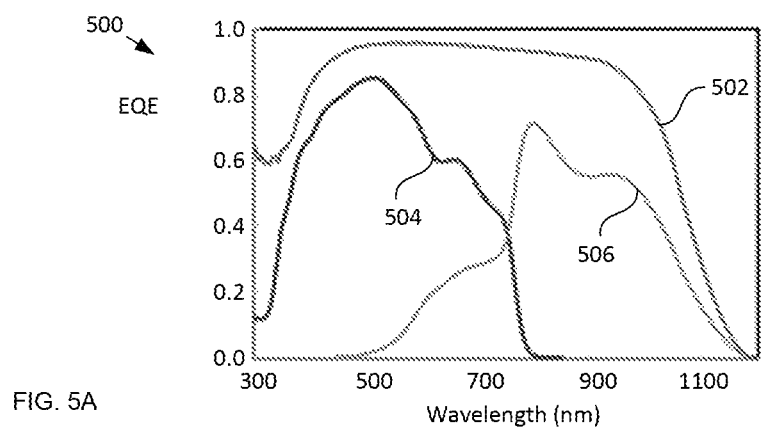
FIG. 5A depicts plots of the external quantum efficiency (EQE) for tandem solar cell 400.

FIG. 5A depicts plots of the external quantum efficiency (EQE) for tandem solar cell 400. Plot 500 shows measured EQE of individual solar cells 100 and 402 in response to light signal 118. Traces 502 and 504 show the EQE of the individual silicon and perovskite solar cells, respectively, under direct illumination by the light signal such that the light incident on the solar cells spans the full range of 300 nm to 1200 nm. Trace 506 shows EQE for individual solar cell 402 when illuminated by light signal 118 after it has passed through perovskite-based solar cell 100. Solar cell 402 is referred to as "unfiltered" when directly illuminated with light signal 118 and "filtered" when it is illuminated by the light signal after it has passed through solar cell 100.

Figure 5B:
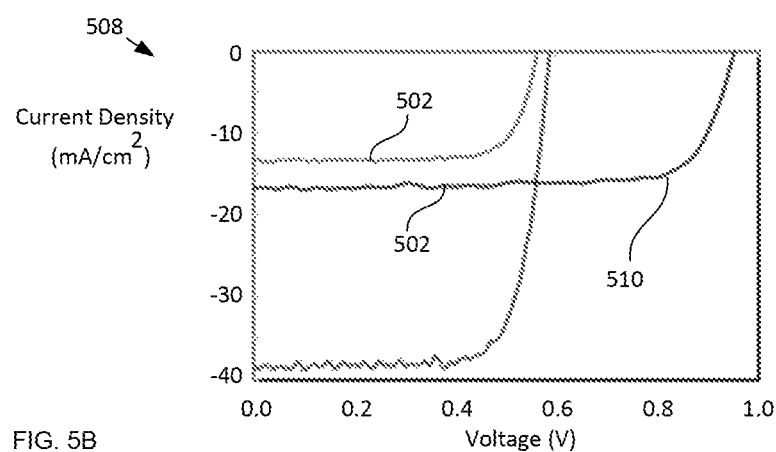
FIG. 5B depicts J-V curves for solar cell 100 and filtered and unfiltered solar cell 402.

FIG. 5B depicts J-V curves for solar cell 100 and filtered and unfiltered solar cell 402.

Table 2 below summarizes measurement data obtained for solar cells 100 and 402.

TABLE 2

Photovoltaic parameters of individual solar cells 100 and 402, as well as stacked tandem configuration 400.

| | $J_{SC}$ [mA/cm$^2$] | VOC [mV] | FF | Efficiency [%] |
|---|---|---|---|---|
| Solar Cell 100 (individually) | 16.5 | 952 | 0.774 | 12.3 |
| Solar Cell 402 (unfiltered) | 38.3 | 587 | 0.754 | 17.0 |
| Solar Cell 402 (filtered) | 13.3 | 562 | 0.762 | 5.7 |
| Tandem solar cell 400 | | | | 18.0 |

The data shows that the efficiency of unfiltered solar cell 402 is 17.0%. It should be noted that the Voc of solar cell 402 is limited due to excess shaded area from the aperture mask used during its illumination, as well as the absorption of the light signal in top contact 114. In the mechanically stacked configuration, in which light signal 118 passes through solar cell 100 prior to impinging on solar cell 402, the combined efficiency of the two solar cells is 18.0% with a JSC of 13.3 mA/cm$^2$ from the bottom cell (i.e., solar cell 402).

It is an additional aspect of the present invention that a nanoparticle-based buffer layer, such as buffer layer 112, enables a sputtered ITO contact layer that acts as a barrier for moisture ingress, methylammonium egress, while the buffer layer itself protects the contact layer from halide-based corrosion.

It is yet another aspect of the present invention that the inclusion of a buffer layer comprising oxide-based nanoparticles enables monolithically integrated tandem solar cells comprising perovskite-based top cells combined with bottom cells that can include any of a wide range of materials, such as silicon, CIGS, a lower EG perovskite, and the like.

Figure 6:
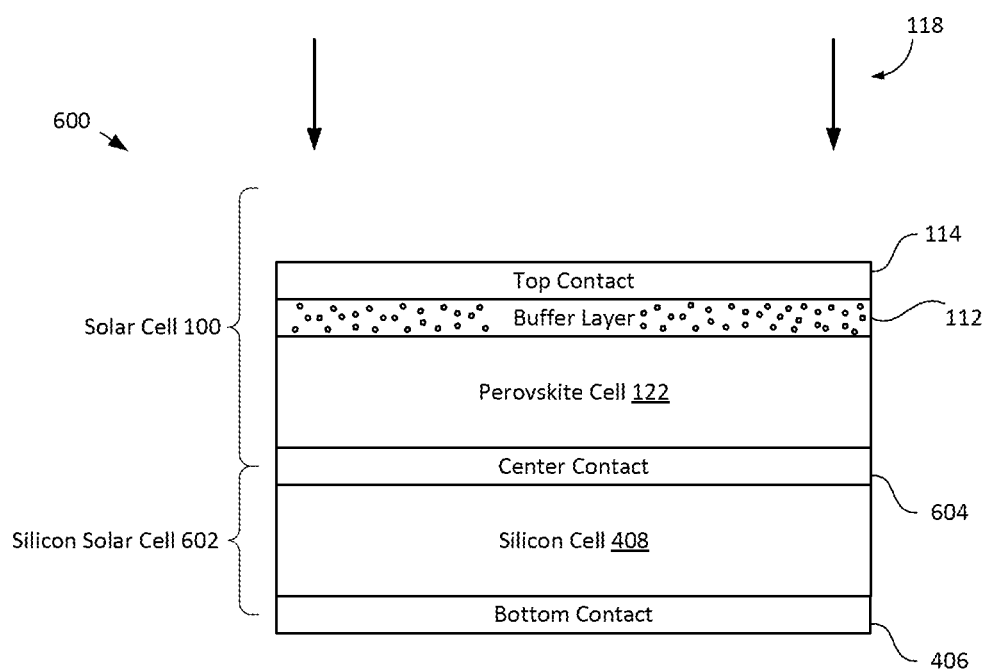
FIG. 6 depicts a schematic drawing of a cross-sectional view of the salient features of another tandem solar cell in accordance with the present invention.

FIG. 6 depicts a schematic drawing of a cross-sectional view of the salient features of another tandem solar cell in accordance with the present invention. Solar cell 600 includes solar cell 100 and silicon solar cell 602, which collectively form a monolithically integrated tandem solar cell structure. For the purposes of this Specification, including the appended claims, the term "monolithically integrated" is defined as formed by depositing layers on a single substrate via one or more thin-film deposition processes and, optionally, patterning the deposited layers after deposition. The term monolithically integrated explicitly excludes structures wherein two or more fully fabricated devices are joined, after their fabrication on separate substrates, to form a unitary structure.

Solar cell 602 is a silicon heterojunction solar cell that is analogous to solar cell 402 described above and with respect to FIG. 4; however, rather than conventional top contact 410, solar cell 602 includes center contact 604, which is dimensioned and arranged to support the monolithic integration of the layers of the solar cell 100.

The fabrication of solar cell 602, up to the formation of center contact 604, is as described above and with respect to silicon solar cell 402.

To form center contact 604, a thin (e.g., 20-nm thick) layer of ITO is deposited through a shadow mask to define multiple conductive regions (e.g., 1 cm by 1 cm). These ITO regions provide a recombination junction between the silicon and perovskite cells with minimal parasitic absorption. It should be noted that the ITO layer can be very thin because lateral conductivity is not of concern at this junction. It should also be noted that the shape of the ITO regions can be other than square.

Once an appropriate center contact has been formed, the thin-film layer structure of solar cell 100 is formed on solar cell 602 in substantially the same manner as described above and with respect to FIGS. 1 and 2. It should be noted that, when formed in a monolithically integrated tandem configuration, substrate 102 is not included in solar cell 100.

It should be noted, however, that the processes used to fabricate the constituent layers of solar cell 100 must be compatible with the solar structure on which they are formed. For example, in some embodiments, hole-selective layer 106 comprises a material other than PEDOT:PSS, such as NiO. An NiO layer, however, is typically annealed at 300° C. for several minutes after its deposition. Unfortunately, such an annealing step would lead to hydrogen loss in the doped amorphous silicon layers and/or crystallization of the amorphous silicon layers of silicon solar cell 602 and compromise their passivation properties. As a result, in accordance with the present invention, a hole-selective layer comprising NiO is annealed at a lower temperature for a longer period of time (e.g., at 200° C. for 10 hours) than would normally be used in the prior art.

It is yet another aspect of the present invention that the formation of an effective buffer layer and top contact using low-temperature, solution-based processing enables monolithically integrated multi-junction solar cell structures (i.e., having two or more junctions) that are not possible in the prior art—specifically, multi-junction configurations that include perovskite absorption layers in every one of the stacked cells.

Figure 7:
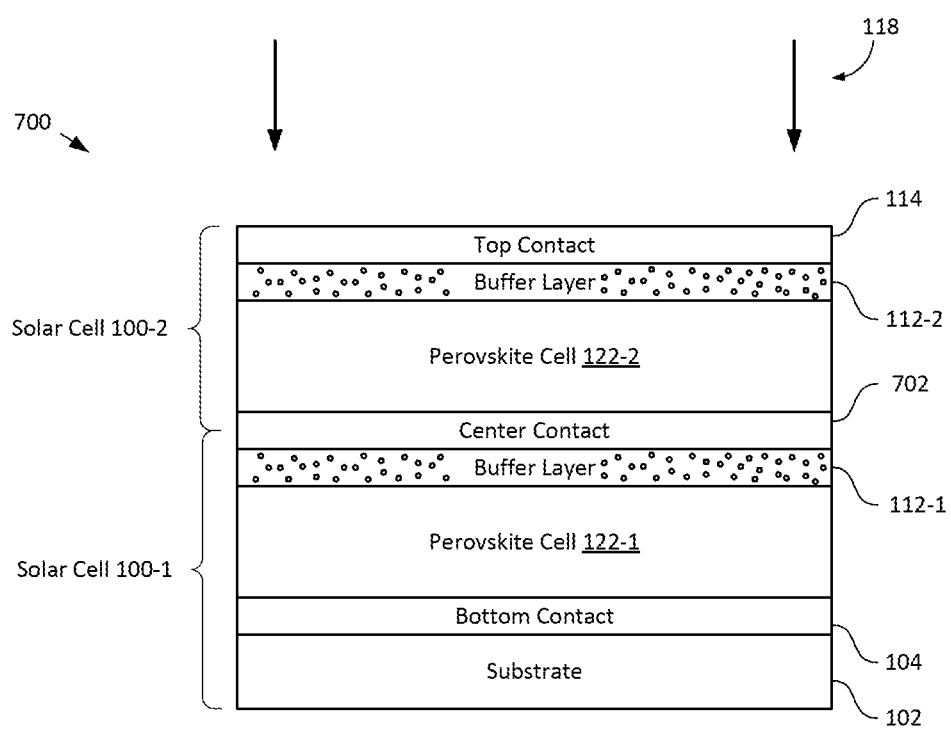
FIG. 7 depicts a schematic drawing of a cross-sectional view of the salient features of another tandem solar cell in accordance with the present invention.

FIG. 7 depicts a schematic drawing of a cross-sectional view of the salient features of another tandem solar cell in accordance with the present invention. Solar cell 700 includes solar cell 100-1 and solar cell 100-2, which collectively form a monolithically integrated, completely perovskite-based tandem solar cell structure.

Each of solar cells 100-1 and 100-2 is analogous to solar cell 100, described above; however, perovskite cells 122-1 and 122-2 are formed such that the EG of perovskite cell 122-1 is lower than the EG of perovskite cell 122-2. In some embodiments, at least one of perovskite cells 122-1 and 122-2 has a regular (i.e., not inverted) architecture.

In the depicted example, perovskite cell 122-1 comprises $MAPbI_3$ perovskite having an EG of approximately 1.6 eV, while perovskite cell 122-2 comprises $MAPbBr_3$ perovskite having an EG of approximately 2.3 eV.

Center contact 702 is analogous to top contact 114; however, in some embodiments, center contact 702 includes a plurality of separate conductive regions as described above and with respect to center contact 604.

Solar cell 700 is formed using sequential applications of method 200, described above. It should be noted that, since all operations of method 200 are performed at low temperature (i.e., 150° C.), there is no theoretical limit to the number of solar cell structures that can be included in a multi-junction solar cell. As a result, monolithically integrated stacked solar cell devices having three or more junctions can be made simply by employing method 200 the requisite number of times.

Table 3 below summarizes a portion of the design space for a multi-junction solar cell, such as solar cell 700.

layer stack 802 as part of perovskite cell 122-1. The first perovskite layer has an EG that is higher than the EG of silicon.

Method 200 is then repeated such that a second perovskite layer is formed such that it resides on layer stack 804 as part of perovskite cell 122-2. The second perovskite layer has an EG that is higher than the EG of the first perovskite layer.

As a result, each solar cell structure of solar cell 800 is operative for converting the energy of a different portion of the wavelength spectrum of light signal 118 into electrical energy.

It is to be understood that the disclosure teaches only examples of the illustrative embodiment and that many variations of the invention can easily be devised by those skilled in the art after reading this disclosure and that the scope of the present invention is to be determined by the following claims.

What is claimed is:

1. A method for forming an optoelectronic device, the method comprising:
   providing a first organic layer;
   forming a first buffer layer comprising a first plurality of oxide nanoparticles, wherein the first buffer layer is configured to protect the first organic layer during a sputter-deposition process; and
   forming a first transparent conductive electrode such that it is disposed on the first buffer layer, wherein the first transparent conductive electrode includes a first layer that is formed via sputter deposition.

2. The method of claim 1 wherein the first organic layer comprises a first perovskite.

3. The method of claim 1 wherein the first buffer layer is formed by operations including:
   providing a first solution comprising a solvent and the first plurality of nanoparticles, wherein the nanoparticles of the first plurality thereof comprise a wide bandgap oxide;
   distributing the first solution to form a nascent first buffer layer; and
   enabling the removal of the solvent from the first solution, wherein the solvent is removed while the temperature of the optoelectronic device remains less than or equal to 200° C.

TABLE 2

Theoretical performance for two-junction and three-junction solar cell structures.

| | Si, CIGS | 1.48 eV Perov. | 1.60 eV Perov. | 2.0 eV Perov. | Si + 1.75 eV Perov. | Si + 2.0 eV Perov. | Si + 1.48 eV Perov. + 2.0 eV Perov. |
|---|---|---|---|---|---|---|---|
| Dark Current (A) | 4E−16 | 2.61E−21 | 4E−23 | 16.5 | 952 | 0.774 | 12.3 |
| Photocurrent (A) | 0.044 | 0.0298 | 0.0254 | 0.0147 | 0.0211 | 0.0147 | 0.0143 |
| $V_{OC}$ (V) | 0.83 | 1.12 | 1.23 | 1.569 | 2.18 | 2.69 | 3.52 |
| SQ PCE (%) | 32 | 30 | 28 | 27 | 41 | 36 | 45 |

Figure 8:
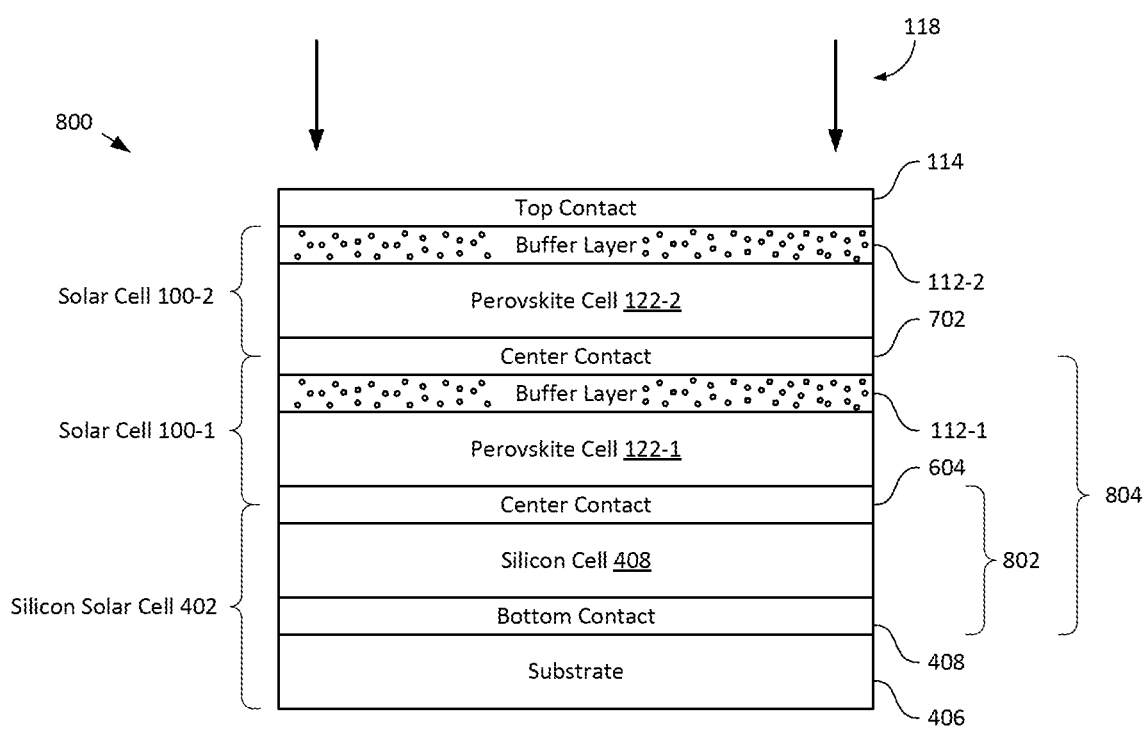
FIG. 8 depicts a schematic drawing of a cross-sectional view of an example of a three-junction solar cell device in accordance with the present invention.

FIG. 8 depicts a schematic drawing of a cross-sectional view of an example of a three-junction solar cell device in accordance with the present invention. Solar cell 800 includes silicon solar cell 402 and solar cells 102-1 and 102-2, which are monolithically integrated on substrate 406.

In order to fabricate solar cell 800, method 200 is performed twice. In the first performance of the method, a first perovskite absorption layer is formed such that it resides on 4. The method of claim 1 wherein the first layer includes indium tin oxide (ITO).

5. The method of claim 1 further comprising forming the first organic layer on a first layer stack comprising a first absorption layer having a first energy bandgap (EG);
   wherein the first organic layer is formed such that is comprises a first perovskite having a second EG that is higher than the first EG; and wherein the first layer stack includes a second transparent conductive electrode that is between the first organic layer and the first absorption layer.

6. The method of claim 5 further comprising:
forming a second organic layer on a second layer stack comprising the first organic layer and the first absorption layer, wherein the second organic layer comprises a second perovskite having a third EG that is higher than the second EG;
forming a second buffer layer comprising a second plurality of oxide nanoparticles, the second organic layer being between the second layer stack and the second buffer layer; and
forming a third transparent conducting electrode on the second buffer layer, the third transparent electrode being formed via a sputtering process.

7. The method of claim 6 wherein the first absorption layer comprises a third perovskite.

8. The method of claim 1 wherein the first plurality of oxide nanoparticles includes at least one nanoparticle comprising a material selected from the group consisting of zinc oxide (ZnO), tin oxide ($SnO_2$), titanium oxide ($TiO_2$), tungsten oxide ($W_2O_3$), aluminum oxide ($Al_2O_3$), silicon dioxide ($SiO_2$), nickel oxide (NiO), and molybdenum oxide ($MoO_x$).

9. The method of claim 8 wherein the oxide nanoparticles of the first plurality thereof are doped with a first dopant that is selected from the group consisting of aluminum, hydrogen, indium, and gallium.

10. The method of claim 1 wherein the optoelectronic device is formed such that it is a device selected from the group consisting of a solar cell, a light emitting diode, and an electrochromic.

11. A method for forming an optoelectronic device, the method comprising:
providing a first organic layer disposed on a substrate, wherein the first organic layer comprises a first perovskite;
forming a first buffer layer configured to protect the first organic layer during a sputter-deposition process, the first buffer layer comprising a first plurality of nanoparticles that includes at least one nanoparticle that comprises a wide-bandgap oxide; and
sputter depositing a first layer such that it is disposed on the first buffer layer and first organic layer, wherein the first layer comprises a first material that is a transparent conductor, and wherein the first layer defines at least a portion of a first transparent conductive electrode.

12. The method of claim 11 wherein the first buffer layer is formed by operations including:
providing a first solution comprising a solvent and the first plurality of nanoparticles, wherein the nanoparticles of the first plurality thereof comprise a wide bandgap oxide;
distributing the first solution to form a nascent first buffer layer; and
enabling the removal of the solvent from the first solution, wherein the solvent is removed while the temperature of the optoelectronic device remains less than or equal to 200° C.

13. The method of claim 11 wherein the first material includes indium tin oxide (ITO).

14. The method of claim 11 further comprising:
forming the first organic layer on a first layer stack comprising a first absorption layer having a first energy bandgap (EG), wherein the first layer stack includes a second transparent conductive electrode that is between the first organic layer and the first absorption layer;
wherein the first perovskite has a second EG that is higher than the first EG; and
wherein the first absorption layer includes a second material that is selected from the group consisting of silicon, copper indium gallium selenide (CIGS), and a perovskite.

15. The method of claim 14 further comprising:
forming a second organic layer such that it is disposed on a second layer stack comprising the first organic layer and the first layer stack, wherein the second organic layer comprises a second perovskite having a third EG that is higher than the second EG;
forming a second buffer layer such that it is disposed on the second organic layer, the second buffer layer comprising a second plurality of nanoparticles that includes at least one nanoparticle comprising a wide-bandgap oxide; and
sputter depositing a third layer such that the third layer is disposed on the second organic layer, wherein the third layer comprises a third material that is a transparent conductor, and wherein the third layer defines at least a portion of a third transparent conductive electrode.

16. The method of claim 14 wherein the second material comprises a third perovskite.

17. The method of claim 11 wherein the at least one nanoparticle includes a material selected from the group consisting of zinc oxide (ZnO), tin oxide ($SnO_2$), titanium oxide ($TiO_2$), tungsten oxide ($W_2O_3$), aluminum oxide ($Al_2O_3$), silicon dioxide ($SiO_2$), nickel oxide (NiO), and molybdenum oxide ($MoO_x$).

18. The method of claim 11 wherein the at least one nanoparticle is doped with a first dopant that is selected from the group consisting of aluminum, hydrogen, indium, and gallium.

19. The method of claim 11 wherein the optoelectronic device is formed such that it is a device selected from the group consisting of a solar cell, a light emitting diode, and an electrochromic.

* * * * *